United States Patent
Johnston et al.

(10) Patent No.: US 7,602,199 B2
(45) Date of Patent: **\*Oct. 13, 2009**

(54) MINI-PROBER FOR TFT-LCD TESTING

(75) Inventors: Benjamin M. Johnston, Los Gatos, CA (US); Sriram Krishnaswami, Saratoga, CA (US); Hung T. Nguyen, Fremont, CA (US); Matthias Brunner, Kirchheim (DE); Yong Liu, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/746,515

(22) Filed: May 9, 2007

(65) Prior Publication Data

US 2007/0296437 A1 Dec. 27, 2007

Related U.S. Application Data

(60) Provisional application No. 60/803,597, filed on May 31, 2006, provisional application No. 60/803,595, filed on May 31, 2006, provisional application No. 60/821,904, filed on Aug. 9, 2006.

(51) Int. Cl.
*G01R 31/02* (2006.01)
*G01R 31/00* (2006.01)
*G01R 31/26* (2006.01)
*G01R 31/28* (2006.01)
*G02F 1/133* (2006.01)

(52) U.S. Cl. .................. 324/754; 324/761; 324/770; 324/765; 324/158.1; 349/31

(58) Field of Classification Search ............ 324/761, 324/770, 754, 757, 158.1; 349/31
See application file for complete search history.

(56) References Cited

U.S. PATENT DOCUMENTS

| 3,983,401 | A | | 9/1976 | Livesay |
| 4,087,747 | A | * | 5/1978 | Deegen et al. ............ 324/72.5 |
| 4,090,056 | A | | 5/1978 | Lockwood et al. |
| 4,362,945 | A | | 12/1982 | Rieke |
| 4,437,044 | A | | 3/1984 | Veith |
| 4,471,298 | A | * | 9/1984 | Frohlich .................... 324/72.5 |
| 4,495,966 | A | | 1/1985 | Longamore |

(Continued)

FOREIGN PATENT DOCUMENTS

DE   3636316   5/1989

(Continued)

OTHER PUBLICATIONS

Brunner, et al. "Development of Puma 5500/10K Platform," AKT News, vol. 5, Jan. 2001, pp. 13-14.

(Continued)

*Primary Examiner*—Ha Tran T Nguyen
*Assistant Examiner*—Karen M Kusumakar
(74) *Attorney, Agent, or Firm*—Patterson & Sheridan, LLP

(57) ABSTRACT

An apparatus and method for testing large area substrates is described. The large area substrates include patterns of displays and contact points electrically coupled to the displays. The apparatus includes a prober assembly that is movable relative to the large area substrate and may be configured to test various patterns of displays and contact points. The prober assembly is also configured to test fractional sections of the large area substrate. The apparatus also includes a test chamber configured to store at least two prober assemblies within an interior volume.

19 Claims, 7 Drawing Sheets

U.S. PATENT DOCUMENTS

| | | | |
|---|---|---|---|
| 4,528,452 A | 7/1985 | Livesay | |
| 4,532,423 A | 7/1985 | Tojo et al. | |
| 4,684,808 A | 8/1987 | Plies | |
| 4,725,736 A | 2/1988 | Crewe | |
| 4,740,705 A | 4/1988 | Crewe | |
| 4,760,567 A | 7/1988 | Crewe | |
| 4,761,607 A | 8/1988 | Shiragasawa et al. | |
| 4,764,818 A | 8/1988 | Crew | |
| 4,772,846 A | 9/1988 | Reeds | |
| 4,795,912 A | 1/1989 | Maschke | |
| 4,818,933 A | 4/1989 | Kerschner et al. | |
| 4,819,038 A | 4/1989 | Alt | |
| 4,843,312 A | 6/1989 | Hartman et al. | |
| 4,862,075 A | 8/1989 | Choi | |
| 4,870,357 A | 9/1989 | Young | |
| 4,899,105 A | 2/1990 | Akiyama | |
| 4,965,515 A | 10/1990 | Karasawa | |
| 4,983,833 A | 1/1991 | Brunner et al. | |
| 4,985,676 A | 1/1991 | Karasawa | |
| 4,985,681 A | 1/1991 | Brunner et al. | |
| 5,081,687 A | 1/1992 | Henley et al. | |
| 5,124,635 A | 6/1992 | Henley | |
| 5,170,127 A | 12/1992 | Henley | |
| 5,175,495 A | 12/1992 | Brahme et al. | |
| 5,177,437 A | 1/1993 | Henley | |
| 5,258,706 A | 11/1993 | Brunner et al. | |
| 5,268,638 A | 12/1993 | Brunner et al. | |
| 5,278,494 A | 1/1994 | Obigane | |
| 5,285,150 A | 2/1994 | Henley | |
| 5,313,156 A | 5/1994 | Klug et al. | |
| 5,365,034 A | 11/1994 | Kawamura et al. | |
| 5,368,676 A | 11/1994 | Nagaseki et al. | |
| 5,369,359 A | 11/1994 | Schmitt | |
| 5,371,459 A | 12/1994 | Brunner et al. | |
| 5,414,374 A | 5/1995 | Brunner et al. | |
| 5,416,592 A | 5/1995 | Mori et al. | |
| 5,430,292 A | 7/1995 | Honjo et al. | |
| 5,432,461 A | 7/1995 | Henley | |
| 5,459,410 A | 10/1995 | Henley | |
| 5,504,438 A | 4/1996 | Henley | |
| 5,521,522 A | 5/1996 | Abe et al. | |
| 5,528,158 A | 6/1996 | Sinsheimer et al. | |
| 5,530,370 A | 6/1996 | Larighof et al. | |
| 5,558,717 A | 9/1996 | Zhao | |
| 5,621,333 A | 4/1997 | Long et al. | |
| 5,644,245 A | 7/1997 | Saitoh et al. | |
| 5,657,139 A | 8/1997 | Hayashi | |
| 5,691,764 A | 11/1997 | Takeoshi et al. | |
| 5,742,173 A | 4/1998 | Nakagomi et al. | |
| 5,774,100 A | 6/1998 | Aoki et al. | |
| 5,801,545 A | 9/1998 | Takeoshi et al. | |
| 5,801,764 A | 9/1998 | Koizumi et al. | |
| 5,834,007 A | 11/1998 | Kubota | |
| 5,834,773 A | 11/1998 | Brunner et al. | |
| 5,892,224 A | 4/1999 | Nakasuji | |
| 5,923,180 A | 7/1999 | Botka et al. | |
| 5,930,607 A | 7/1999 | Satou | |
| 5,936,687 A | 8/1999 | Lee | |
| 5,973,323 A | 10/1999 | Adler et al. | |
| 5,982,190 A | 11/1999 | Toro-Lira | |
| 5,985,190 A | 11/1999 | Toro-Lira | |
| 6,033,281 A | 3/2000 | Toro-Lira | |
| 6,046,599 A | 4/2000 | Long et al. | |
| 6,075,245 A | 6/2000 | Toro-Lira | |
| 6,086,362 A | 7/2000 | White et al. | |
| 6,137,303 A | 10/2000 | Deckert et al. | |
| 6,145,648 A | 11/2000 | Teichman et al. | |
| 6,191,598 B1 | 2/2001 | Hollman | |
| 6,198,299 B1 | 3/2001 | Hollman | |
| 6,265,889 B1 | 7/2001 | Tomita et al. | |
| 6,281,701 B1 | 8/2001 | Yang et al. | |
| 6,288,561 B1 | 9/2001 | Leedy | |
| 6,297,656 B1 | 10/2001 | Kobayashi et al. | |
| 6,320,568 B1 | 11/2001 | Zavracky | |
| 6,337,722 B1 | 1/2002 | Ha | |
| 6,337,772 B2 | 1/2002 | Uehara et al. | |
| 6,340,963 B1 | 1/2002 | Anno et al. | |
| 6,343,369 B1 | 1/2002 | Saunders et al. | |
| 6,356,098 B1 | 3/2002 | Akram et al. | |
| 6,362,013 B1 | 3/2002 | Yoshimura | |
| 6,380,729 B1 | 4/2002 | Smith | |
| 6,435,868 B2 | 8/2002 | White et al. | |
| 6,450,469 B1 | 9/2002 | Okuno | |
| 6,501,289 B1 | 12/2002 | Takeoshi | |
| 6,528,767 B2 | 3/2003 | Bagley et al. | |
| 6,559,454 B1 | 5/2003 | Murrell et al. | |
| 6,566,897 B2 | 5/2003 | Lo et al. | |
| 6,570,553 B2 | 5/2003 | Hashimoto et al. | |
| 6,690,185 B1* | 2/2004 | Khandros et al. | 324/758 |
| 6,730,906 B2 | 5/2004 | Brunner et al. | |
| 6,759,867 B2* | 7/2004 | Sohn | 324/770 |
| 6,765,203 B1 | 7/2004 | Abel | |
| 6,777,675 B2 | 8/2004 | Parker et al. | |
| 6,798,231 B2 | 9/2004 | Iwasaki et al. | |
| 6,828,587 B2 | 12/2004 | Yamazaki et al. | |
| 6,833,717 B1 | 12/2004 | Kurita et al. | |
| 6,836,140 B2 | 12/2004 | Fujikawa et al. | |
| 6,873,175 B2 | 3/2005 | Toro-Lira | |
| 6,985,193 B2 | 1/2006 | Jang et al. | |
| 6,992,290 B2 | 1/2006 | Watanabe et al. | |
| 6,995,576 B2 | 2/2006 | Imai | |
| 7,005,641 B2 | 2/2006 | Nakasuji et al. | |
| 7,043,848 B2 | 5/2006 | Hollman et al. | |
| 7,077,019 B2 | 7/2006 | Weis et al. | |
| 7,084,970 B2 | 8/2006 | Weiss et al. | |
| 7,088,117 B2 | 8/2006 | Uher et al. | |
| 7,137,309 B2 | 11/2006 | Weis et al. | |
| 7,180,084 B2 | 2/2007 | Weis et al. | |
| 7,189,998 B2 | 3/2007 | Cha et al. | |
| 7,245,134 B2* | 7/2007 | Granicher et al. | 324/754 |
| 7,298,163 B2* | 11/2007 | Takada | 324/770 |
| 7,319,450 B2 | 1/2008 | Choi et al. | |
| 7,327,158 B1 | 2/2008 | Jun | |
| 7,330,583 B2* | 2/2008 | Clark et al. | 382/149 |
| 7,332,869 B2 | 2/2008 | Yoo et al. | |
| 2001/0035767 A1 | 11/2001 | Listwan | |
| 2001/0052788 A1 | 12/2001 | Tomita | |
| 2002/0024023 A1 | 2/2002 | Brunner et al. | |
| 2002/0034886 A1 | 3/2002 | Kurita et al. | |
| 2002/0047838 A1 | 4/2002 | Aoki et al. | |
| 2003/0209323 A1 | 11/2003 | Yokogaki | |
| 2003/0218456 A1 | 11/2003 | Brunner et al. | |
| 2004/0145383 A1 | 7/2004 | Brunner et al. | |
| 2004/0246018 A1* | 12/2004 | Takada | 324/770 |
| 2005/0040338 A1 | 2/2005 | Weis et al. | |
| 2005/0179451 A1 | 8/2005 | Brunner et al. | |
| 2005/0179452 A1* | 8/2005 | Brunner et al. | 324/751 |
| 2005/0254045 A1 | 11/2005 | Weiss et al. | |
| 2006/0038554 A1 | 2/2006 | Kurita et al. | |
| 2006/0096395 A1 | 5/2006 | Weiss et al. | |
| 2006/0226865 A1 | 10/2006 | Gallarda et al. | |
| 2006/0237627 A1 | 10/2006 | Gardner et al. | |
| 2006/0279304 A1 | 12/2006 | Kuitani et al. | |
| 2007/0030478 A1 | 2/2007 | Kim et al. | |
| 2007/0109011 A1 | 5/2007 | Jun et al. | |
| 2007/0109278 A1 | 5/2007 | Moon | |
| 2007/0164773 A1 | 7/2007 | Moon et al. | |
| 2008/0002137 A1 | 1/2008 | Kim et al. | |
| 2008/0024157 A1 | 1/2008 | Jun | |
| 2008/0036905 A1 | 2/2008 | Moon et al. | |

| | | | |
|---|---|---|---|
| 2008/0036933 | A1 | 2/2008 | Na et al. |
| 2008/0044996 | A1 | 2/2008 | Baek et al. |

FOREIGN PATENT DOCUMENTS

| | | |
|---|---|---|
| DE | 19832297 | 9/2001 |
| EP | 0204855 | 12/1986 |
| EP | 0370276 | 1/1991 |
| EP | 0402499 | 9/1991 |
| EP | 0537505 | 11/1993 |
| EP | 0523594 | 12/1993 |
| EP | 0523584 | 6/1994 |
| EP | 0614090 | 9/1994 |
| EP | 0542094 | 11/1994 |
| EP | 0762137 | 3/1997 |
| EP | 0806700 | 11/1997 |
| EP | 0932182 | 7/1999 |
| EP | 0999573 | 5/2000 |
| EP | 1045425 | 10/2000 |
| EP | 1045426 | 10/2000 |
| EP | 1233274 | 8/2002 |
| JP | 60-039748 | 3/1985 |
| JP | 63-88741 | 4/1988 |
| JP | 63-88742 | 4/1988 |
| JP | 63-166132 | 7/1988 |
| JP | 63-318054 | 12/1988 |
| JP | 1-307148 | 12/1989 |
| JP | 6-167538 | 6/1994 |
| JP | 7-302563 | 11/1995 |
| JP | 8-173418 | 7/1996 |
| JP | 8-289231 | 11/1996 |
| JP | 1-213944 | 8/1999 |
| JP | 11-264940 | 9/1999 |
| JP | 2000-180392 | 6/2000 |
| JP | 2000-223057 | 8/2000 |
| JP | 2000-268764 | 9/2000 |
| JP | 2001-033408 | 2/2001 |
| JP | 2001-318116 | 11/2001 |
| JP | 2001-358189 | 12/2001 |
| JP | 2002-039976 | 2/2002 |
| JP | 2002-048740 | 2/2002 |
| JP | 2002-257997 | 9/2002 |
| JP | 2002-310959 | 10/2002 |
| JP | 2002-343294 | 11/2002 |
| JP | 2004-014402 | 1/2004 |
| KR | 19990014615 | 5/1999 |
| KR | 20040061673 | 7/2004 |
| KR | 100449515 | 9/2004 |
| KR | 100490056 | 5/2005 |
| KR | 20050075636 | 7/2005 |
| KR | 20060123003 | 12/2006 |
| KR | 20060128446 | 12/2006 |
| KR | 20070019061 | 2/2007 |
| KR | 20070039667 | 4/2007 |
| KR | 20070063315 | 6/2007 |
| KR | 20070067761 | 6/2007 |
| KR | 20070083007 | 8/2007 |
| KR | 20070117184 | 12/2007 |
| KR | 20070117188 | 12/2007 |
| KR | 20070117190 | 12/2007 |
| KR | 20070117191 | 12/2007 |
| TW | 344876 | 11/1998 |
| TW | 427551 | 3/2001 |
| TW | 459140 | 10/2001 |
| TW | 473772 | 1/2002 |
| TW | 511207 | 11/2002 |
| TW | 512428 | 12/2002 |
| TW | 536630 | 6/2003 |
| TW | 2003-01535 | 7/2003 |
| TW | 541430 | 7/2003 |
| WO | WO 92-09900 | 6/1992 |
| WO | WO 98-31050 | 7/1998 |
| WO | WO 99-23684 | 5/1999 |
| WO | WO 99-60614 | 11/1999 |
| WO | WO 02-33745 | 4/2002 |
| WO | WO 02-45137 | 6/2002 |

OTHER PUBLICATIONS

Brunner, M., "TFT Array Testing: Replacing Mechanics by Electron Beam Deflection," AKT News, vol. 6, Apr. 2001, pp. 15-17.
Invitation to pay additional fees dated Oct. 21, 2003 for PCT/US03/15903 (AMAT/7356.PC).
European Search Report for EP 03 026 267.9, dated Apr. 5, 2004 (ZIMR/0005).
Invitation to pay additional fees dated May 11, 2005 for PCT/US04/043202 (AMAT/8500.PC).
PCT Search Report and Written Opinion for PCT/US2004/043202, dated Jul. 28, 2005 (AMAT/8500.PC).
TIPO Official Action for patent application No. 94123638, dated Dec. 25, 2006 (AMAT/8500.TW.02).
German Search Report, dated Jul. 18, 2003, for DE 10253717.8 (ZIMR/0005).
German Examination Report, dated Jul. 14, 2003 for DE 10253717.8 (ZIMR/0005).
PCT English Translation of International Preliminary Exam for PCT/EP03/06481, dated Mar. 10, 2005 (ZIMR/0014).
Kumada, et al, "Non-Contact Array Testers" LCD Panel Process Inspection Technology (No. 10).
PCT International Search Report for PCT/US03/15903, dated Jan. 16, 2004, (AMAT/7356.PC).
PCT Search Report and Written Opinion for PCT/US2005/26866, dated Aug. 30, 2006 (AMAT/8500.PC.03).
International Search Report and Written Opinion of the International Searching Authority, mailed Feb. 5, 2008 (PCT/US07/68642).

* cited by examiner

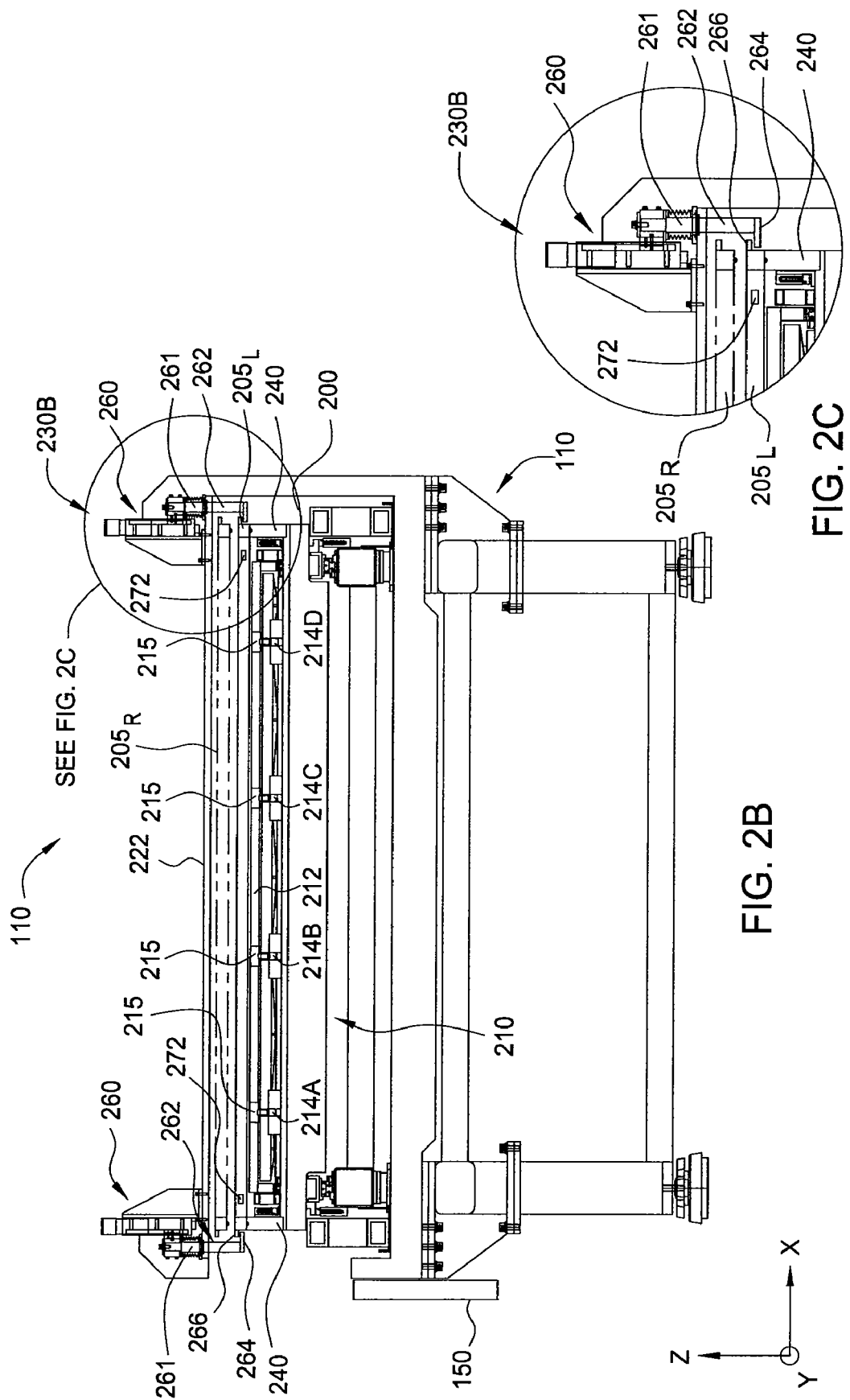

MINI-PROBER FOR TFT-LCD TESTING

CROSS-REFERENCE TO RELATED APPLICATIONS

This application claims benefit of U.S. Provisional Patent Application Ser. No. 60/803,597, filed May 31, 2006, which is incorporated herein by reference. This application is also related to the following U.S. Provisional Patent Applications: Ser. No. 60/803,595, filed May 31, 2006; and Ser. No. 60/821,904, filed Aug. 9, 2006, each of the aforementioned patent applications incorporated herein by reference.

BACKGROUND OF THE INVENTION

1. Field of the Invention

Embodiments of the present invention generally relate to a test system for substrates. More particularly, the invention relates to an integrated testing system for large area substrates in the production of flat panel displays.

2. Description of the Related Art

Flat panel displays, sometimes referred to as active matrix liquid crystal displays (LCD's), have recently become commonplace in the world as a replacement for the cathode ray tubes of the past. The LCD has several advantages over the CRT, including higher picture quality, lighter weight, lower voltage requirements, and low power consumption. The displays have many applications in computer monitors, cell phones and televisions to name but a few.

One type of active matrix LCD includes a liquid crystal material sandwiched between a thin film transistor (TFT) array substrate and a color filter substrate to form a flat panel substrate. Generally, the TFT substrate includes an array of thin film transistors, each coupled to a pixel electrode, and the color filter substrate includes different color filter portions and a common electrode. When a certain voltage is applied to a pixel electrode, an electric field is created between the pixel electrode and the common electrode, orienting the liquid crystal material to allow light to pass therethrough for that particular pixel. The substrates used typically include a large surface area and many independent flat panel displays are formed on the large area substrate, which are subsequently separated from the substrate during final manufacturing.

A part of the manufacturing process requires testing of the large area substrate to determine the operability of pixels in each flat panel display. Voltage imaging, charge sensing, and electron beam testing are some processes used to monitor and troubleshoot defects during the manufacturing process. In a typical electron beam testing process, TFT response within the pixels is monitored to provide defect information. In one example of electron beam testing, certain voltages are applied to the TFT's, and an electron beam may be directed to the individual pixel electrodes under investigation. Secondary electrons emitted from the pixel electrode area are sensed to determine the TFT voltages.

Generally, a test apparatus, such as a prober assembly, is used to apply or sense voltages from the TFT's by contacting conductive areas on the large area substrate. The prober assembly is sized and adapted to test a specific configuration of flat panel displays laid out on the substrate. The prober assembly typically has an area sized equal to or greater than the dimensions of the substrate, and this large area of the prober assembly creates handling, transfer, and storage challenges.

Therefore, there is a need for a prober assembly to perform testing on large area substrates that addresses some of the challenges discussed above.

SUMMARY OF THE INVENTION

Embodiments described herein relate to testing electronic devices on large area substrates. In one embodiment, a test system is described. The test system includes a testing table sized to receive a rectangular substrate, and a prober assembly adapted to contact the large area substrate, wherein the prober assembly includes a dimension equal to or less than half of a dimension of the rectangular substrate.

In one embodiment, a prober assembly adapted to test a large area substrate having a length and a width is described. The prober assembly includes a rectangular frame having a first dimension that is equal to or less than half of the length of the large area substrate and a second dimension that is equal to or greater than the width of the large area substrate, and a plurality of prober pins extending from a lower surface of the frame and adapted to contact the large area substrate.

In another embodiment, a prober assembly adapted to test a large area substrate is described. The prober includes a rectangular frame, and a plurality of contact heads coupled to a length of the frame and adapted to contact the large area substrate, wherein the rectangular frame comprises an area that is equal to or less than half of the area of the large area substrate.

In another embodiment, a test system is described. A testing table sized to receive a rectangular substrate, and a prober assembly adapted to contact the large area substrate, wherein the prober assembly includes a rectangular frame, and a plurality of prober pins extending from a lower surface of the frame and adapted to contact the large area substrate, wherein the rectangular frame comprises an area that is equal to or less than half of the area of the large area substrate and is movable by at least two motors along the length of the testing table.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2B is a sectional end view of one embodiment of a testing chamber.

FIG. 2C is an exploded view of a portion of the testing chamber of FIG. 2B.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The term substrate as used herein refers generally to large area substrates made of glass, a polymeric material, or other substrate materials suitable for having an electronic device formed thereon. Various embodiments are described herein relate to testing electronic devices, such as TFT's and pixels located on flat panel displays. Other electronic devices that may be located on a large area substrate and tested include photovoltaic cells for solar cell arrays, organic light emitting diodes (OLED's), among other devices. The testing procedures are exemplarily described using an electron beam or charged particle emitter under vacuum, but certain embodiments described herein may be equally effective using optical devices, charge sensing, or other testing applications configured to test electronic devices on large substrates in vacuum conditions, or at or near atmospheric pressure.

Embodiments depicted in this application will refer to various drives, motors and actuators that may be one or a combination of the following: a pneumatic cylinder, a piezoelectric motion device, a hydraulic cylinder, a magnetic drive, a stepper or servo motor, a screw type actuator, or other type of motion device that provides vertical movement, horizontal movement, combinations thereof, or other device suitable for providing at least a portion of the described motion.

Various components described herein may be capable of independent movement in horizontal and vertical planes. Vertical is defined as movement orthogonal to a horizontal plane and will be referred to as the Z direction. Horizontal is defined as movement orthogonal to a vertical plane and will be referred to as the X or Y direction, the X direction being movement orthogonal to the Y direction, and vice-versa. The X, Y, and Z directions will be further defined with directional insets included as needed in the Figures to aid the reader.

Figure 1:
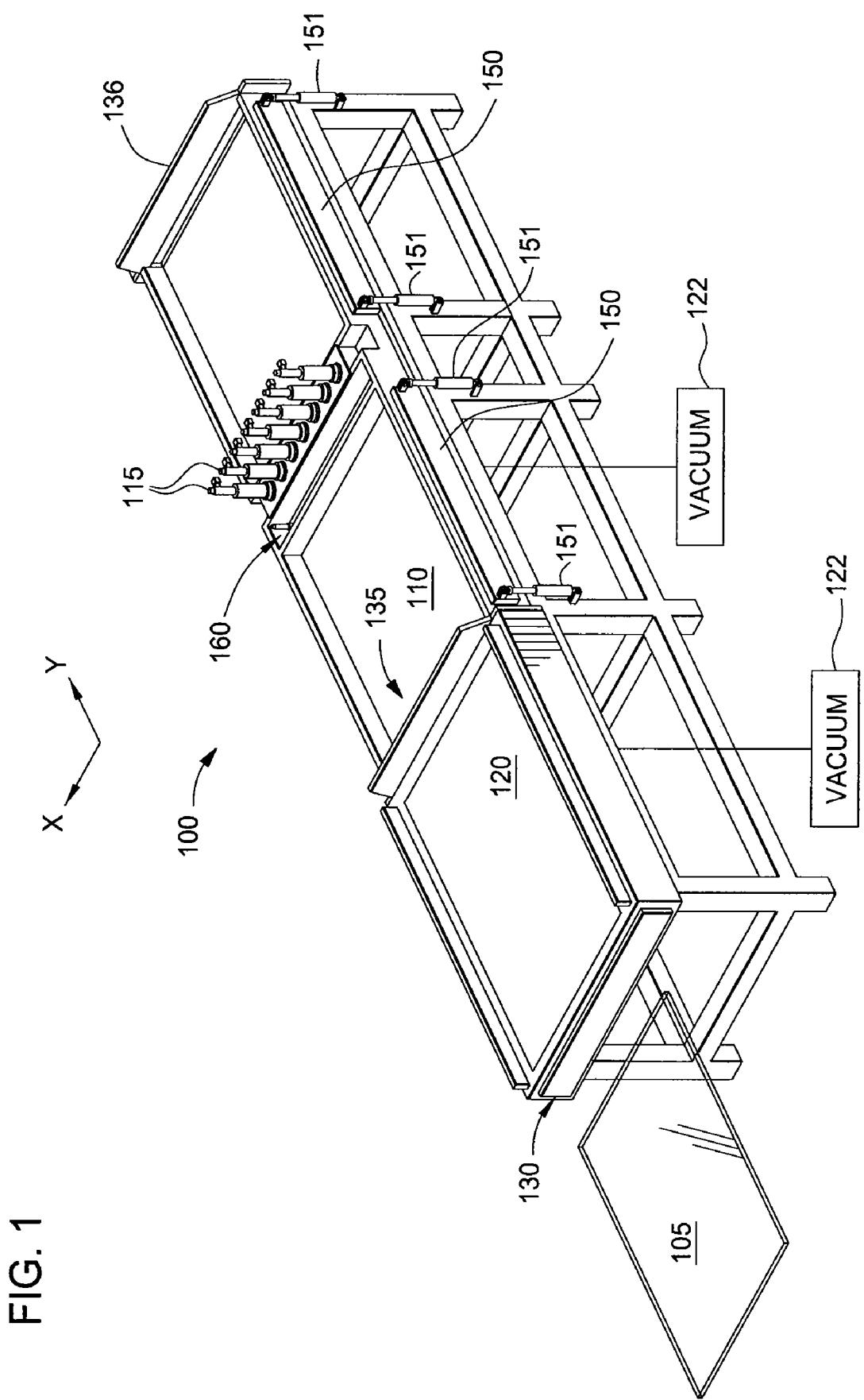
FIG. 1 is an isometric view of one embodiment of a test system.

FIG. 1 is an isometric view of one embodiment of a test system 100 adapted to test the operability of electronic devices located on large area substrates, for example, large area substrates having dimensions up to and exceeding about 2200 mm by about 2600 mm. The test system 100 includes a testing chamber 110, a load lock chamber 120, and a plurality of testing columns 115 (seven are shown in FIG. 1), which are exemplarily described as electron beam columns adapted to test electronic devices located on large area substrates, such as thin film transistors (TFT's). A plurality of sensing devices (not shown) to sense backscattered electrons are located adjacent the testing columns 115 within the interior volume of the testing chamber 110. The test system 100 is typically located in a clean room environment and may be part of a manufacturing system that includes substrate handling equipment, such as robotic equipment or a conveyor system, that transports one or more large area substrates to and from the testing system 100. In one embodiment, the test system 100 also includes a microscope assembly 160 coupled to an upper surface of the testing chamber 110 to view areas of interest encountered on the large area substrate.

The interior of the testing chamber 110 is accessible at least by a valve 135 between the load lock chamber 120 and the testing chamber 110. The interior may also be accessed by one or more movable sidewalls 150, each including at least one actuator 151, to facilitate opening and closing of the movable sidewalls 150 alone, or in combination. The movable sidewalls 150 provide access for maintenance and inspection of the interior of the testing chamber 110, and facilitate transfer of one or more testing devices, such as a prober assembly (not shown). The movable sidewalls 150 are configured to provide vacuum sealing, when closed, by o-rings, gaskets, and the like. In another embodiment (not shown), an upper surface of the testing chamber 110 may be adapted to open and close for access to the interior and/or facilitate transfer of one or more testing devices. At least an upper surface of the testing chamber 110 may be hinged, be adapted to raise and lower, move laterally, or combinations thereof. An example of various components of an electron beam test system for testing large area substrates are described in U.S. patent application Ser. No. 11/375,625, filed Mar. 14, 2006 and published as United States Patent Publication No, 2006/0244467 on Nov. 2, 2006, U.S. patent application Ser. No. 11/190,320, filed Jul. 27, 2005 and published as United States Patent Publication No. 2006/0038554 on Feb. 23, 2006, and U.S. Pat. No. 6,833,717, which issued Dec. 21, 2004, entitled "Electron Beam Test System with Integrated Substrate Transfer Module," which applications are incorporated by reference herein.

The load lock chamber 120 is sealable from ambient environment and is typically coupled to one or more vacuum pumps 122, and the testing chamber 110 may be coupled to one or more vacuum pumps 122 that are separate from the vacuum pumps of the load lock chamber 120. In one embodiment, the load lock chamber 120 is adapted to receive the large area substrate 105 from the clean room environment through an entry port 130, facilitate transfer of the substrate from the load lock chamber 120 to the testing chamber 110 through the valve 135, and return the large area substrate to the clean room environment in a converse manner. In another embodiment, the large area substrate 105 enters the test system 100 through the entry port 130, which is then transferred from the load lock chamber 120 to the testing chamber 110 through the valve 135, and the large area substrate is returned to the clean room environment through a port 136 coupled to the opposite end of the testing chamber 110. Alternatively, one or more load lock chambers may be coupled orthogonally to the testing chamber 110 to form a "U" shaped processing system or a "Z" shaped processing system (not shown). Other embodiments of the testing chamber 110 and various embodiments of substrate entry/exit arrangements are more fully described in United States Patent Publication No. 2006/0244467, previously incorporated by reference.

The load lock chamber 120 may be a dual slot load lock chamber configured to facilitate transfer of at least two large area substrates. Examples of a dual slot load lock chamber are described in U.S. Pat. No. 6,833,717, previously incorporated by reference, and U.S. patent application Ser. No. 11/298,648, filed Dec. 8, 2005 and published as United States Patent Publication No. 2006/0273815 on Dec. 7, 2006, and U.S. Provisional Patent Application No. 60/911,496, filed Apr. 12, 2007, both of which are incorporated by reference herein.

Figure 2A:
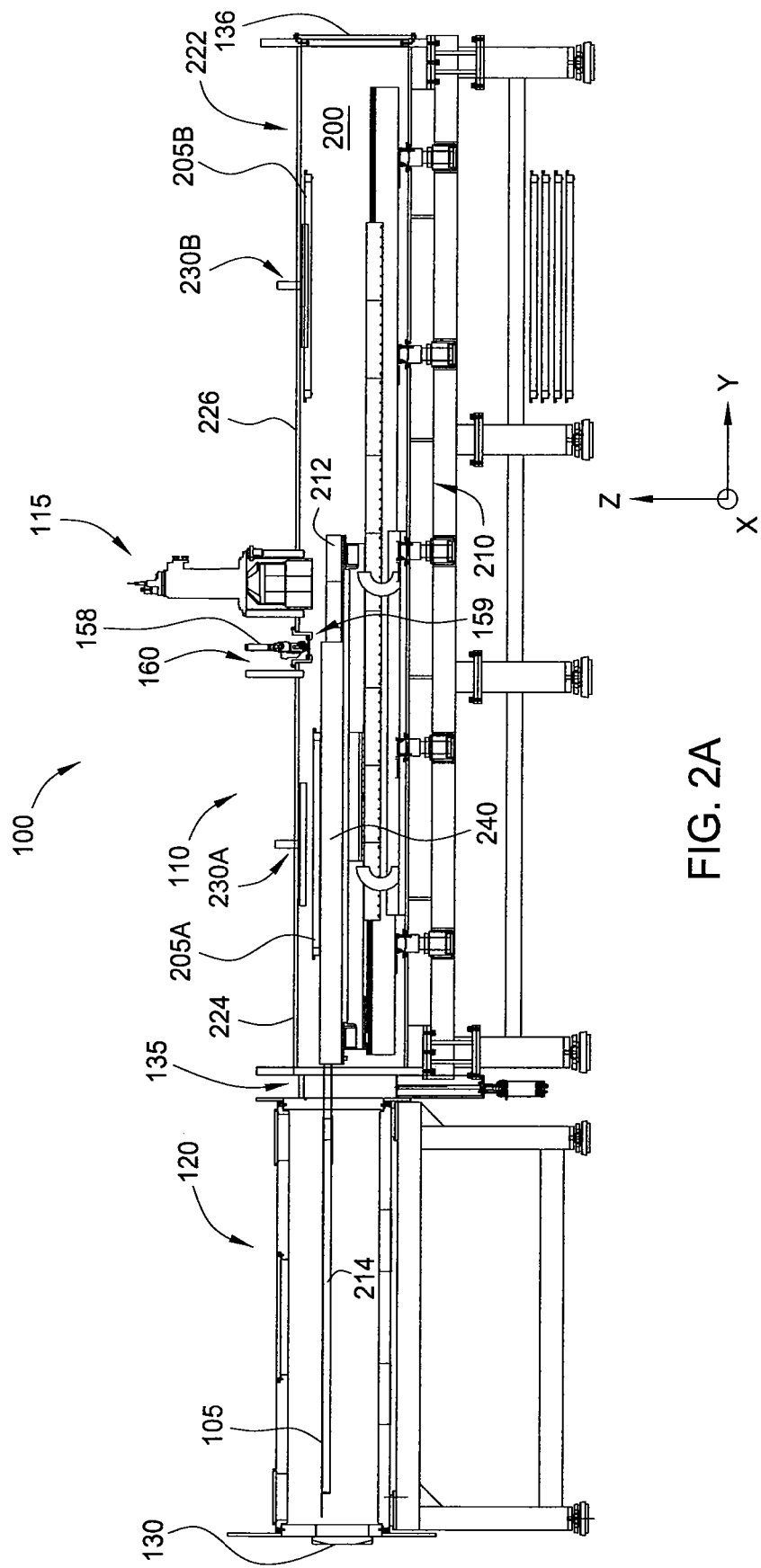
FIG. 2A is a sectional side view of another embodiment of a test system.

FIG. 2A is a sectional side view of the test system 100 shown in FIG. 1. The testing chamber 110 is coupled to the load lock chamber 120, which includes a substrate 105 disposed therein. The testing chamber 110 includes an interior volume 200, which includes a testing table 210, two prober assemblies, such as prober 205A and prober 205B, and a portion of the testing columns 115. In another embodiment (not shown), the interior volume 200 is adapted to include more than two prober assemblies, wherein the at least one of the prober assemblies may be used or readied for a testing sequence, and the other prober assemblies are stored in the interior volume 200.

In one embodiment, the testing table 210 includes three substantially planar stages stacked on one another. In one aspect, each of the three stages independently move along orthogonal axes, such as X, Y, and Z directions. The upper stage 212 is configured to support the substrate 105 during testing and includes multiple panels having slots therebetween to receive a plurality of fingers (shown in FIG. 2B) of an end effector 214. In one embodiment, the upper stage 212 moves at least in the Z direction and the end effector 214 extends laterally (Y direction) therefrom to transfer the substrate to and from the load lock chamber 120. Details of an end effector and testing table can be found United States Publication No. 2006/0244467, previously incorporated by reference.

In one embodiment, the test system 100 is configured to transport a large area substrate 105 having electronic devices located thereon through a testing sequence along a single directional axis, shown in the Figure as the Y direction. In other embodiments, the testing sequence and/or pre-testing may include a combination of movement along the X and Y directions. For example, the substrate may be moved by one or both of the upper stage 212 and the end effector 214 to correct misalignment in substrate position before testing. In other embodiments, the testing sequence may include Z directional movement provided by one or both of the testing columns 115 and testing table 210. The substrate 105 may be introduced into the test system 100 along either the substrate width or substrate length. The Y directional movement of the substrate 105 in the test system allows the system dimensions to be slightly larger than the width or length dimensions of the substrate 105. The movement of the support table along a single directional axis may also eliminate or minimize the drives required to move the support table in the X direction. The height of the load lock chamber 120 and the testing chamber 110 can be minimized as a result of the unidirectional movement. The reduced height combined with the minimal width of the testing system provides a smaller volume in the load lock chamber 120 and the testing chamber 110. This reduced volume decreases pump-down and vent time in the load lock chamber 120 and the testing chamber 110, thereby enhancing throughput of the test system 100.

The testing chamber 110 also includes a top 222, which includes a first section 224 and a second section 226. The first section 224 includes a microscope assembly 160, which includes a microscope 158 movably positioned above a view port 159 in the first section 224 of the top 222. The view port 159 is a transparent or semi-transparent strip made of glass, plastic, quartz, or other transparent material, and is configured to withstand negative pressure. In one embodiment, one or both of the microscope 158 and microscope assembly 160 moves horizontally (X direction) to view areas of interest on the substrate when the substrate is positioned below the view port 159. In a specific embodiment, the microscope 158 includes a focus module to adjust depth of field.

The first section 224 and the second section 226 each include one prober lift assembly coupled to the top 222, shown in the Figure as prober lift assembly 230A and prober lift assembly 230B. In other embodiments (not shown), the first section and the second section may include more than one prober lift assembly each. Each prober lift assembly 230A, 230B provides a positioning and storage function for each prober 205A, 205B. For example, the prober lift assembly 230A moves vertically to place the prober on, or remove the prober from, the upper surface of opposing support members 240 (only one is shown in this view) on opposite sides of the testing table 210. The prober lift assembly 230B is supporting prober 205B in a position adjacent the lower surface of the top 222 in order to allow for clearance and movement of the testing table 210 (and prober 205A) thereunder.

FIG. 2B is a sectional end view of the testing chamber 110 shown in FIG. 2A and FIG. 2C is an exploded view of a portion of the testing chamber 110 shown in FIG. 2B. The interior volume 200 includes the testing table 210 and a portion of the prober lift assembly 230B. The testing table 210 includes the upper stage 212 and a plurality of fingers 214A-214D of the end effector that are positioned in slots 215 between the multiple panels of the upper stage 212. In one embodiment, the slots 215 are dimensioned to allow at least vertical (Z direction) movement of the fingers 214A-214D through the slots 215. In another embodiment, the slots 215 are dimensioned to allow lateral (X direction) movement of the fingers 214A-214D as well as vertical movement (Z direction).

In one application, the testing table 210 may be any stage or support capable of supporting a substrate 105 and moving the substrate 105 linearly. Additionally or alternatively, the testing table 210 may be stationary and the substrate 105 may be adapted to move relative to the testing table 210 in a linear direction. The testing chamber 110 and/or load lock chamber 120 may be optional as the testing procedure may not require vacuum application. The testing columns 115 may be electron beam columns, charged particle emitters, charge sensors, charge-coupled devices, cameras, and other devices capable of sensing the operability of electronic devices on the large area substrate 105.

In one embodiment, the prober lift assembly 230B, which is similar to prober lift assembly 230A, includes two motors 260 coupled to an upper surface of the top 222 on opposing sides of the testing chamber 110. The motors 260 provide at least vertical (Z direction) movement to respective lift members 262 within the interior volume 200. Each of the motors 260 are coupled to a shaft 261 that extends through the top 222 and is adapted to maintain vacuum within the interior volume 200 by seals, a flexible boot, bellows, and the like. In an alternative embodiment (not shown), the prober lift assembly 230B may include only one motor coupled to an upper surface of the top 222. In this embodiment, the motor may be adapted to provide rotational movement, as well as vertical movement, to the one lift member used to support an individual prober.

Figure 4A:
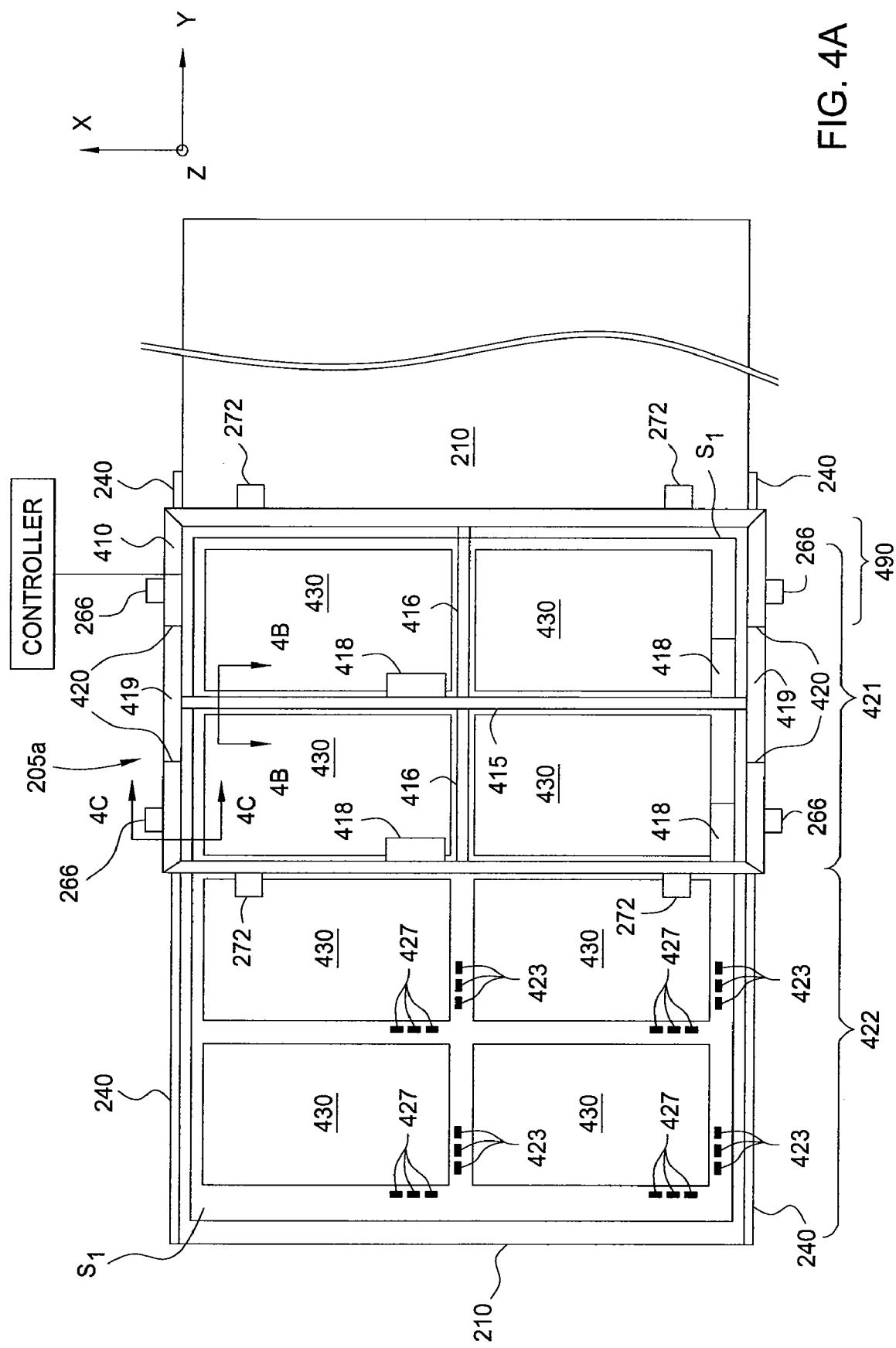
FIG. 4A is a sectional top view of one embodiment of a prober 205A and a substrate.

The prober lift assembly 230B is configured to provide a storage and transfer function for a prober. For example, the stored prober is shown in phantom as raised prober $205_R$ and a transferred prober is shown on the prober support member 240 as lowered prober $205_L$. Each prober $205_R$, $205_L$ generally comprises a frame having a plurality of lugs 266, 272 extending therefrom on opposing sides of the frame as shown in FIG. 4A. In one embodiment (not shown), the lugs 266, 272 are extended members extending from and along substantial portions of an outer perimeter of the frame. In this embodiment, each side of the frame comprises one lug 266 or 272 that may run along the length of each side of the frame. In another embodiment, the lugs 266, 272 comprise extended members in the form of ears or tabs that extend from and along smaller portions of the outer perimeter of the frame. For example, the frame of the prober $205_L$ has four lugs 272 in the X axis (only two are shown in this view) and four lugs 266 in the Y axis (only two are shown in this view).

The lugs 266, 272 are spaced apart at least horizontally and provide a mating interface for prober transfer or storage. For example, the lugs 272 provide a transfer interface for an atmospheric to chamber exchange, while the lugs 266 are adapted to mate with respective extensions 264 to provide a transfer interface for an intra-chamber exchange. When the prober is not being transferred, the lugs 266 provide support points for storage in the interior volume 200, and the lugs 272 provide support points for storage outside the testing chamber 110. Each of the plurality of lugs 266, 272 may include a slot, an aperture, a hole, and combinations thereof formed therein (not shown) to receive a pin, or other stabilizing device disposed on a device the lugs are intended to mate with during transfer, such as extensions 264. Examples of a transfer device and operation that may be used are described in FIGS. 14A-16 of United States Patent Publication No. 2006/0038554, previously incorporated by reference.

Figure 3A:
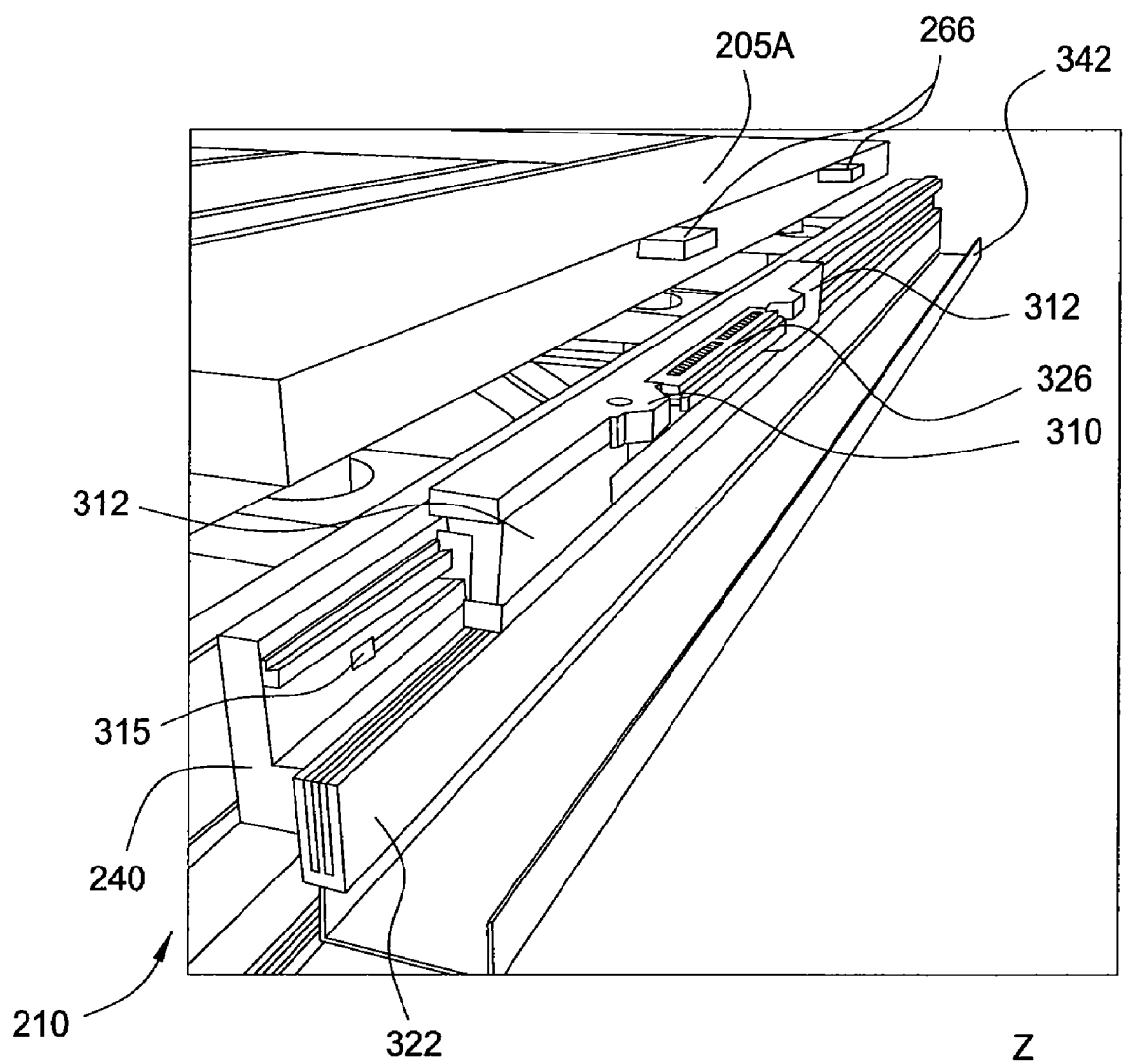
FIG. 3A is a perspective view of one embodiment of a prober support member.

FIG. 3A is a perspective view of one embodiment of a prober support member 240. As shown in FIG. 2B, the test system 100 comprises two prober support members 240 on opposing sides of the testing table 210 and only one side of the testing table 210 is shown in this view. Each prober support member 240 includes a prober platform 310 having one or more drives 312 coupled thereto. In one embodiment, each prober platform 310 includes two drives 312 and the prober platform 310 is adapted to be movable along the length (Y direction) of the prober support member 240 by the drives 312. In one embodiment, the drives 312 are linear drives coupled to a magnet channel 322 and lateral positioning may be facilitated by an encoder strip 315 along the length of the prober support member 240. The prober support member 240 also includes a tray 342 to support wires and cables as the prober support member 240 and/or the prober platform 312 travels along the length of the testing table 210 and the length of the prober support member 240.

Figure 3B:
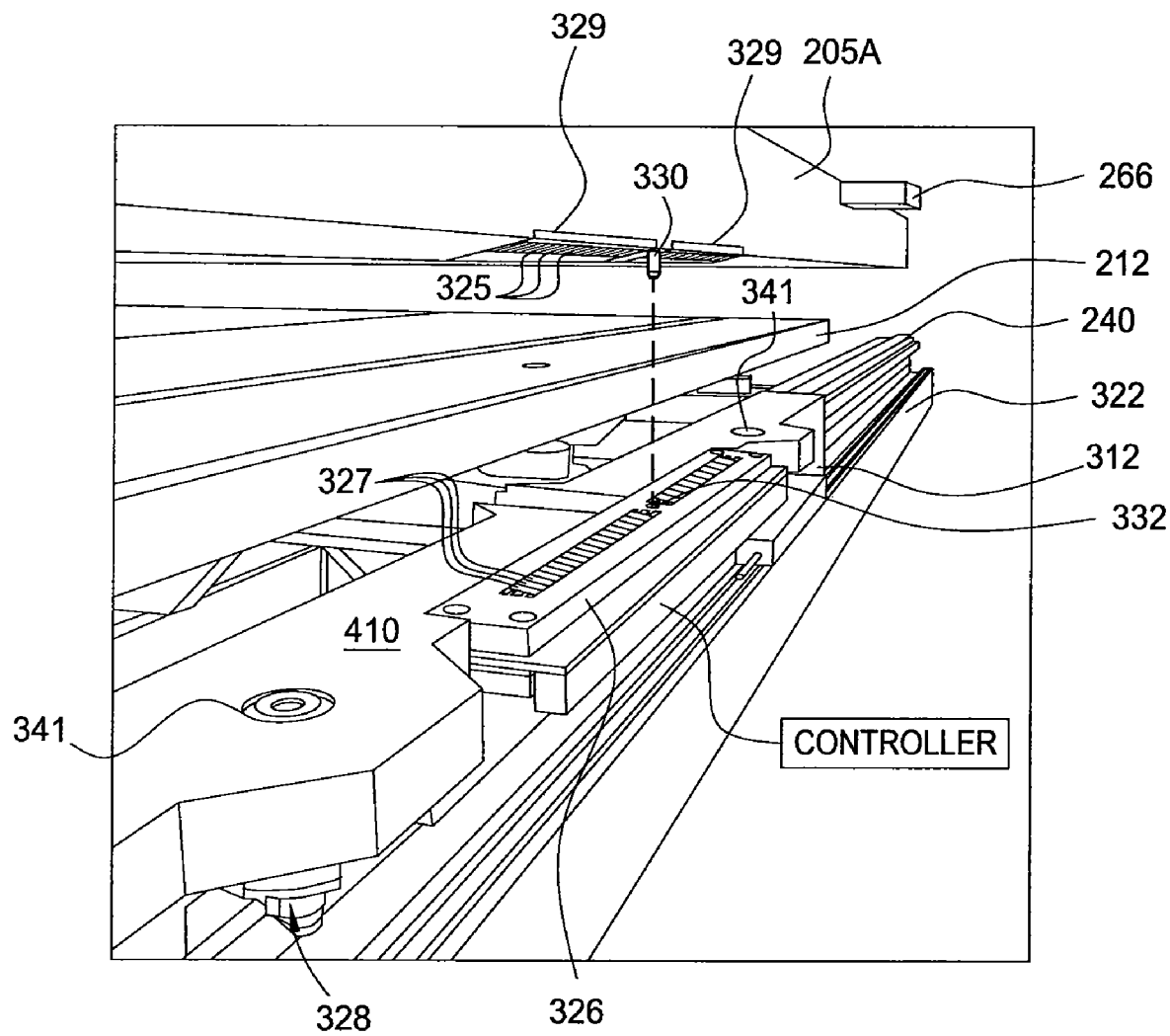
FIG. 3B is a perspective view of one embodiment of a prober platform.

FIG. 3B is a perspective view of one embodiment of a prober platform 310. The prober platform 310 comprises at least one prober lift 328 configured to contact a portion of the prober 205A to lower and raise (Z direction) the prober 205A relative to the prober platform 310. The prober lift 328 may be actuated by any device adapted to provide at least vertical movement, and may be coupled to any portion of the prober platform 310. In one example, the prober lift 328 is coupled to the prober platform 310 and a shaft extends through an opening 341 in the upper surface of the prober platform 310.

The prober platform 310 includes a substantially planar upper surface adapted to receive and support the prober 205A when transferred to the prober support 240. To facilitate receiving the prober 205A, the prober platform 310 includes a depression, such as an indexing hole 332, that is adapted to receive a pin 330 extending from the bottom surface of the prober 205A. The interface between the pin 330 and hole 332 enhances alignment of the prober 205A relative to the prober support 240 and provides stability when the testing table 210 and/or prober platform 310 is moved.

Alignment of the prober 205A relative to the prober platform 310 enables alignment of the prober 205A relative to the substrate 105 and any devices to be tested thereon. The alignment also enables electrical coupling between the prober 205A and the test system 100 by aligning a plurality of electrical contact plates 329 on a lower surface of the prober 205A and a signal interface 326 on the upper surface of the prober platform 310. The electrical contact plates 329, each of which may include a plurality of contact points 325, facilitate electrical signals provided to, or received from, the prober 205A (described in more detail in reference to FIGS. 4A and 4B). The signal interface 326 is adapted to facilitate electrical communication of the signals to or from the prober 205A to a controller. The contact plates 329, which may be a printed circuit board coupled to the lower surface of the prober 205A, are adapted to mate with a plurality of contactors 327 coupled to the signal interface 326. In one embodiment, the contactors 327 on the signal interface 326 are spring loaded to facilitate electrical communication between the contactors and the contact points 325.

Embodiments described herein provide loading of at least two probers for use in testing operations in the testing chamber 110 while the testing chamber is open to the clean room environment, which is typically at or near atmospheric pressure. As described below, the embodiments described herein increase throughput by minimizing venting and pump down time by providing the at least two probers to the testing chamber 110 for storage and use in testing operations. Users that manufacture and test multiple substrate layouts may queue the substrates for introduction to the testing chamber 110. Once the substrate queue has been determined to include at least two substrate layouts requiring different probers, the at least two probers may be pre-loaded into the testing chamber 110 for use in a testing procedure with the at least two substrate layouts.

In one example, a prober, such as prober 205A, is selected for use in a testing sequence for a specific substrate layout to be tested. For example, the substrate layout to be tested-substrate $S_1$ for ease of description-has a particular display and contact pad pattern, and the prober 205A is designed or configured to test substrate $S_1$. It is to be noted that a manufacturer may produce a plurality of substrate $S_1$'s all having substantially identical display and contact pad configurations. The manufacturer may also produce a substrate or substrates-substrate $S_2$ for ease of description-having a different display and contact pad arrangement than substrate $S_1$. Substrate $S_2$ may require a different prober, such as prober 205B, for testing substrate $S_2$. Embodiments described herein facilitate testing of differing substrates, such as substrates $S_1$ and $S_2$, by providing at least one prober to be used for testing, and at least one prober stored for use in subsequent testing.

In one operational embodiment in reference to FIGS. 2A-3B, the prober 205A is transferred to the testing chamber 110 by a prober exchanger (not shown) to facilitate atmospheric to chamber transfer. In one embodiment, the prober exchanger is positioned outside of the testing chamber 110 adjacent one or both of the movable sidewalls 150. The prober exchanger includes a rectangular frame that may be adjusted, at least in width, to receive, store, and transfer at least one prober. An example of a prober exchanger can be found in the descriptions of United States Patent Publication No. 2006/0273815, and FIGS. 14A-16 of United States Patent Publication No. 2006/0038554, both applications previously incorporated by reference. To transfer a different prober to the testing chamber 110 when the testing chamber 110 has been previously pumped down, the chamber may be vented, and one or both of the movable sidewalls 150 are opened as shown in FIG. 2B. The prober exchanger includes a pair of movable prober supports that mate with the lugs 272 on opposing sides of the prober frame. Both movable prober supports are adapted to extend laterally (X direction) simultaneously from the prober exchanger into the testing chamber 110 through the movable sidewall 150. Sufficient clearance is provided between the prober support member 240 and the lift assemblies 262 as the prober lift assemblies 230A, 230B are retracted upward (Z direction). The prober 205A is transferred by the movable prober supports to a position above the prober support member 240, wherein two opposing sides of the prober frame may contact respective sides of the prober support member 240.

Once extended above the prober support member 240, the movable prober supports are actuated downward (Z direction) to allow the lower surface of the prober frame to contact the upper surface of the prober support member 240. After contact, the movable prober supports continue downward (Z direction) until the mating interface between the movable prober supports and lugs 272 allow the movable prober supports to be retracted laterally (X direction) out of the testing chamber 110.

The prober 205A, when contacted and supported by the prober support member 240, may be stored by one of the prober lift assemblies 230A, 230B. In one embodiment, the testing table 210, having the prober supports 240 coupled thereto, may be actuated laterally (Y direction) to position the prober 205A below either of the prober lift assemblies 230A, 230B. In another embodiment, the prober supports 240, which comprise a plurality of drives (shown in FIGS. 3A and 3B) may move independent of the testing table 210 and actuated laterally (Y direction) to position the prober 205A below either of the prober lift assemblies 230A, 230B. As an example, the storage process will be described in reference to prober 205A.

In this example, when the prober 205A is substantially aligned and positioned under the prober lift assembly 230A, the prober lift assembly 230A may be actuated downward (Z direction) to a position adjacent the prober 205A. Specifically, the lift members 262 are lowered by the motors 260 to a position adjacent the lugs 266 on opposing sides of the prober 205A. Each of the lift members 262 include at least two extensions 264 that extend inward and are adapted to mate with the lugs 266.

In one embodiment, the upper surface of the extensions 264 are configured to support each of the lugs 266 from a bottom surface of the respective lug 266. To provide this support configuration, the prober 205A, specifically the lugs 266 disposed thereon, must be positioned to provide clearance for the extensions 264 to move downward (Z direction) to a position below and slightly to the side of the bottom of the respective lug 266. The prober 205A may be positioned in the Y direction by one or both of the prober platform 310 and testing table 210 to allow clearance for the extensions. Once the upper surface of the extensions 264 are below and spaced apart horizontally and vertically from the bottom surface of the respective lug 266, the downward movement of the lift member 262 may cease.

The prober 205A may then be moved horizontally (Y direction) by one or both of the prober platform 310 and testing table 210 to a position where the lugs 266 are in a location to mate with the respective extension 264. When the lugs 266 and extensions 264 are aligned, the motors 260 may be actuated to move the respective lift members 262 upward (Z direction) to provide contact between the upper surface of each extension 264 and the bottom of each lug 266. When contact between each extension 264 and each respective lug 266 is made, the motors 260 may continue upward to a limit position adjacent the lower surface of the top 222. The prober 205A is in a storage position within the interior volume 200 and may be used in a later testing sequence. The upper surface of the testing table 210 has sufficient clearance to move horizontally under the prober lift member 230A without interference from the prober 205A in this stored position.

Subsequent to testing in the test system 100, the prober 205B may be provided in the same manner as described in reference to prober 205A with the exception of the transfer sequence to a storage position. For example, the prober 205B may be transferred to the prober support 240 and positioned on the testing table 210. The testing chamber 110 may be sealed and pumped-down and readied for testing. The prober 205B may be positioned on the testing table 210 to provide clearance for subsequent substrate transfer, or the substrate transfer may occur with the prober 205B in any position above the testing table 210.

In another embodiment, a second prober 205B may be provided to the testing chamber 110. In one application, the prober 205B may be transferred to the testing table 210 in the same manner as described in reference to prober 205A. The prober 205B may also be transferred to a storage position as described in reference to prober 205A. Both probers 205A, 205B may be stored to allow the testing table 210 to retrieve a substrate for testing. In this embodiment, the movable sidewalls 150 may be closed and sealed, and the interior volume 200 may be pumped-down and readied for a testing sequence.

After the testing chamber 110 is sealed and pumped-down and if no substrate has been previously transferred to the chamber 110, one of the large area substrates, such as substrate $S_1$ and $S_2$, may be transferred to the testing chamber 110. In this example, substrate $S_1$ is queued first and is transferred to the testing chamber 110 from the load lock chamber 120. If both probers 205A, 205B are in a storage position, one of the probers, in this example prober 205A, is to be used for a testing sequence on substrate $S_1$. The substrate $S_1$ is transferred to the testing table 210 by the end effector 214 (FIG. 2) and positioned on the upper stage 212. Horizontal alignment (X or Y direction) of substrate $S_1$ is monitored by sensors in the interior volume 200 and any misalignment detected may be corrected by horizontal (X or Y direction) movement provided by the end effector 214. Once the substrate $S_1$ is properly aligned, the end effector may lower and place the substrate $S_1$ on the upper stage 212 of the testing table 210.

After the substrate $S_1$ has been positioned on the testing table 210, the testing table 210 and substrate $S_1$ may be in position under the prober lift assembly 230A to facilitate receiving the prober 205A from the stored position. If the testing table 210 and substrate $S_1$ thereon is not in position, the testing table may require horizontal (Y direction) movement to a position beneath the prober lift assembly 230A. This movement to facilitate reception of the prober 205A may require movement in the Y direction by one or both of the testing table 210 and the prober platform 310 coupled to each of the prober supports 240. The testing table 210 may be actuated in the Y direction for a distance and the prober platform 310 may be actuated a distance to facilitate reception of the prober 205A from the prober lift assembly 230A as described in reference to FIGS. 3A and 3B. Once the prober 205A has been transferred from the prober lift assembly 230A to the prober platform 310, specific portions of the prober 205A may be brought into contact with specific portions of the substrate $S_1$.

FIG. 4A is a sectional top view of one embodiment of a prober 205A and a substrate, the prober 205A positioned and supported above the substrate $S_1$ by the prober support member 240. The substrate $S_1$ is generally rectangular and typically includes a large surface area for forming one or more flat panel devices or liquid crystal displays, shown in the Figure as displays 430. Each display 430 typically includes a plurality of conductive areas, such as contact pads 423, 427 that are located adjacent to the outer perimeter of each display 430. The contact pads 423, 427 may be a single conductive contact point, or may be a plurality of conductive contact points sometimes referred to as pad blocks, that are typically arranged parallel to an outer edge of the respective display 430. The contact pads may be provided substantially along the Y axis, and/or substantially along the X axis of the substrate $S_1$, such as contact pads 423 and contact pads 427, respectively. The contact pads 423, 427 may also be known as shorting bars that are adjacent the edge of the displays 430.

In one embodiment, each display 430 includes a perimeter comprising four edges, and each contact pad 423, 427 is located adjacent and slightly outside of the perimeter. The contact pads 423, 427 may be substantially parallel to an edge or edges of the perimeter, or may be angled from the edge or edges. For example, the contact pads may be a plurality of contact points in rows or columns, and the row/column may angle from the edge of the display 430, wherein the row/column is not parallel with the edge of the perimeter. In another embodiment (not shown), contact pads 423, 427 may be located along an edge or edges of the substrate $S_1$.

The contact pads 423, 427 are typically made of a conductive material located or deposited on the substrate $S_1$, and are electrically coupled to devices or rows/columns of devices, such as TFT's, located on the respective display 430. The contact pads 423, 427 provide an interface for an electrical signal to power the TFT's via fine wire connections coupled thereto during final manufacturing. But during testing of the operability of the displays 430, the contact pads 423, 427 provide an interface for a plurality of prober pins 425 (FIGS. 4B-4D), which apply or sense signals from the TFT's on the respective display 430. The signals may be provided by, or sent to, a controller coupled to the prober assembly 205A that is electrically coupled to each of the prober pins 425 by wires or cables.

The prober assembly 205A includes at least a rectangular frame 410, having a first dimension along the Y directional axis that is equal to or less than about half the length of the substrate $S_1$, and a second dimension along the X directional axis that is equal to or greater than the width of the substrate $S_1$. In some embodiments, the frame 410 may include one or more cross-members 415 along the X directional axis. As an option, the frame 410 may also include one or more cross-members 416 along the Y direction coupled to the frame 410 or cross-member 415. The cross-members 415, 416 may be fixed to the frame 410, or may be adjustable along the length or width of the inner surface of the frame 410. Examples of prober assemblies and frames wherein the cross-members and/or frames are adjustable can be found in U.S. patent application Ser. No. 10/889,695, filed Jul. 12, 2004 and published as United States Patent Publication No. 2005/0179451 on Aug. 18, 2005, and U.S. patent application Ser. No. 10/903,216, filed Jul. 30, 2004 and published as United States Patent Publication No. 2005/0179452 on Aug. 18, 2005, both applications are incorporated by reference herein.

In one embodiment, the frame 410 includes joints 420 that provide an adjustment feature to the prober assembly 205A. For example, the joints 420 provide adjustment in the length (Y direction) of the prober assembly 205A wherein a segment 419 may be used. The segment 419 may include any length to adjust the length dimension of the prober assembly 205A for adaptation to various display 330 sizes and contact pad patterns on the substrate 105. The joints 420 may be coupled to the frame 410 by fasteners, such as screws, bolts, pins, latches, and the like. Alternatively, the frame 410 may be a single unitary body.

Figure 4B:
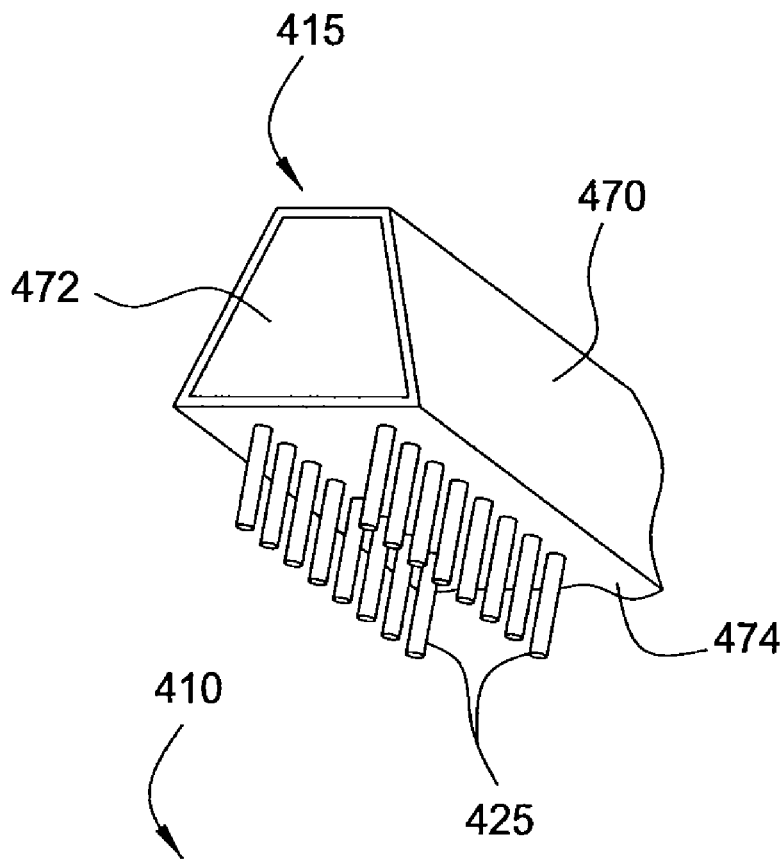
FIG. 4B is an isometric view of a portion of one embodiment of a cross-member.

FIG. 4B is an isometric view of a portion of cross-member 415 from FIG. 4A. The cross-member 415 includes a body 470 and a cross-section 472. In one embodiment, the cross-member 415 is tubular and is made of a lightweight metal, such as aluminum. The cross-section 472 may be shaped as a rectangle, a triangle, a trapezoid, a modified trapezoid, or combinations thereof. The body also includes a lower surface 474 which has a plurality of contact pins 425 extending therefrom, as mentioned in reference to FIG. 4A.

Figure 4C:
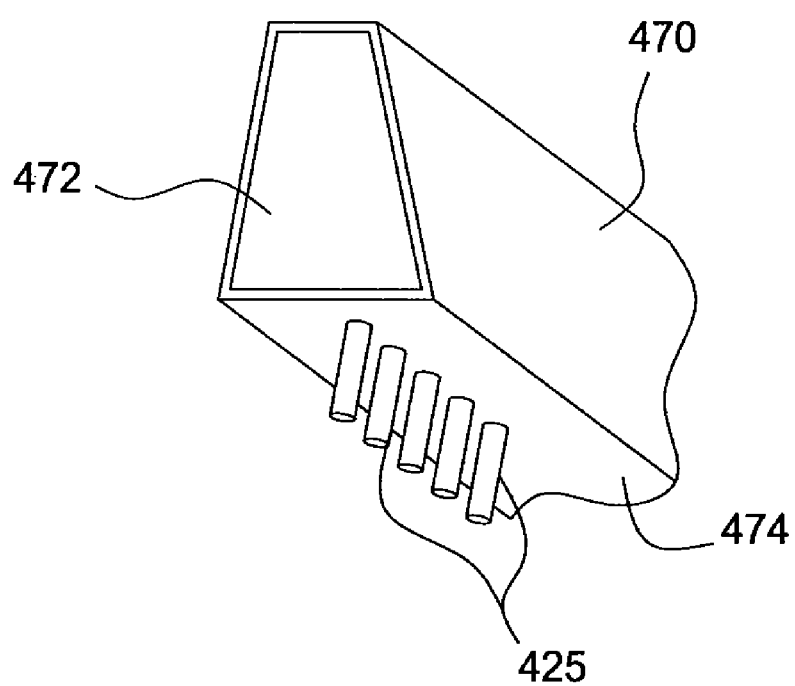
FIG. 4C is an isometric view of a portion of one embodiment of a frame.

FIG. 4C is an isometric view of a portion of the frame 410 from FIG. 4A. The frame 410 includes a body 470 and a cross-section 472 which may be shaped as a rectangle, a trapezoid, a triangle, or combinations thereof. The body 470 includes a lower surface 474 which may comprise a plurality of contact pins 425 in one embodiment, wherein the frame 410 may be used in the testing process. The optional cross-member 416 may also be designed as either the cross-member 415 as depicted in FIG. 4B, or the frame as depicted in FIG. 4C.

The substrate $S_1$ shown in FIG. 4A includes a plurality of displays 430, which in this example is eight 46 inch displays in a substantially uniform layout and spacing on the substrate. In other embodiments, the substrate $S_1$ may include different sizes of displays 430 in different layouts, such as a plurality of equally sized displays, or a combination of large and small displays configured to use the surface area of the substrate $S_1$ efficiently. The prober assembly 205A is configured to provide or sense signals from a portion of the displays in any configuration in a stepwise manner.

The substrate $S_1$ is divided into at least two portions, such as a first portion 421 and a second portion 422. In one embodiment, the portions 421, 422 may equal approximately one-half of the substrate 105 length or width and the prober assembly 205A is sized equal to one of the portions 421, 422. In another embodiment, each portion 421, 422 may equal approximately a third, a fourth, or a fifth, and so on, of the substrate width or length and the prober assembly 205A may be sized equally to one of the portions. In another embodiment, the prober assembly 205A is sized equally or greater than about one-half of the substrate width or length. The prober assembly 205A is adapted to provide or sense signals from at least one display 430 within the respective portion. The prober assembly 205A is configured to test each portion of the substrate as the substrate moves linearly through a test zone 490 formed by the qualitative addressable area of the testing columns (not shown in this view).

The test zone 490 is configured to provide a qualitative addressable area above the substrate $S_1$ that is sufficient to test the length or width of the substrate $S_1$. In one embodiment, the test zone 490 comprises an area between about 1950 mm to about 2250 mm in the X direction and about 240 mm to about 290 mm in the Y direction. In another embodiment, the test zone 490 is between about 1920 mm to about 2320 mm in the X direction and about 325 mm to about 375 mm in the Y direction. Additional information on test areas provided by the testing columns may be found in United States Patent Publication No. 2006/0244467, previously incorporated by reference.

The prober assembly 205A, specifically the prober pins 425 coupled to the frame 410, the cross-members 415, the contact heads 418, and combinations thereof, are brought into contact with the contact pads 423, 427 located on the substrate $S_1$. In one embodiment, this contact is accomplished by vertical (Z direction) actuation of the upper stage 212 to bring the contact pads 423, 427 into contact with the prober pins 425. In other embodiments, the prober pins 425 may be brought into contact with the contact pads 423, 427 by actuation of the prober frame 410, actuation of the prober platform 310, actuation of the cross-members 415, actuation of the contact heads 418, and combinations thereof. Adjustments for misalignment between the contact pads 423, 427 and the prober pins 425 may be corrected by movement of the drives 312 coupled to the prober platform 310 on opposing sides of the testing table 210.

Once contact is established between the contact pads 423, 427 and the prober pins 425, and testing parameters have been determined, the substrate $S_1$, which is supported by the testing table 210, is actuated at least in the Y direction to move the substrate and the prober assembly 205A through the test zone 490. The movement may be a continuous motion, or may be a stepped motion, wherein the table is moved incrementally and stopped intermittently under the test zone 490. Regardless of continuous or intermittent movement, the first portion 421, and all displays 430 within the first portion 421, is moved through the test zone 490 and tested.

After the first portion 421 has moved through the test zone 490, the prober 205A must be transferred from first portion 421 to second portion 422 in order to test the second portion of substrate $S_1$. To accomplish this transfer, the prober lifts 328 (FIG. 3B), coupled to the prober platform 310, are actuated upward (Z direction) to space the prober 205A apart from the prober support 240 and other portions of the testing table 210. The upper stage 212 may also be actuated downward (Z direction) to space the substrate apart from the prober 205A. The prober lifts 328 may have a vertical (Z direction) stroke in a range between about 2 mm to about 10 mm, such as about 5 mm. Once raised, the drives 312 coupled to the prober platform 310 are actuated horizontally (Y direction) to move the prober 205A from the first portion 421 to the second portion 422 along the prober support 240. The drives 312 are synchronized and/or monitored to ensure the travel along both sides of the prober support 240 are substantially equal to provide alignment of the prober 205A on the second portion 422. If the prober 205A is misaligned, the drives 312 may be actuated separately to correct the misalignment.

Once sufficiently aligned and positioned above the second portion 422 the prober lifts 328 may be actuated downward (Z direction) to position the prober 205A on the upper surface of the prober platform 310. The pin 330 (FIG. 3B) coupled to the prober 205A may be disposed in the indexing hole 332 to align the prober 205A on the prober platform 310. Once in a position on the prober platform 310, contact pads 423, 427 may be brought into contact with the prober pins 425, and the testing table 210 may be actuated in the Y direction for a testing sequence on the second portion 422. The second portion 422, and the displays 430 within the second portion 422, may be moved under the test zone 490 and tested.

After testing of all displays 430 in the first portion 421 and second portion 422, the substrate $S_1$ may be transferred from the testing chamber 110. The next substrate queued may be transferred to the testing chamber 110, which may be another substrate having a display and contact pad layout similar to substrate $S_1$. In this case, the prober 205A may remain coupled to the prober platform 310 and the to-be-tested substrate $S_2$ may be transferred to the testing chamber 110. The to-be-tested substrate $S_2$ may be positioned and aligned as described above, and the prober 205A may be positioned above the first section 421 or second section 422. The contact pads and prober pins may be brought into contact, and a testing sequence may commence. Once all displays have been tested, the substrate may be transferred out of the testing chamber 110. This sequence may be repeated as long as the prober 205A is used in the testing procedure.

If the next substrate in the queue-substrate $S_3$ for example, has a different display and contact pad configuration that is different than substrates $S_1$ and $S_2$, prober 205B may be needed to test substrate $S_3$. In this case, prober 205A may be transferred from the testing table 210 to a storage position, and prober 205B may be transferred to the testing table 210 from the stored position. This action requires no venting and opening of the testing chamber 110 to transfer prober 205A out of the testing chamber 110 and transfer prober 205B into the testing chamber 110.

The prober 205A, which is on the upper surface of the prober support 240, may be positioned by one or both of the testing table 210 and prober platform 310, to facilitate transfer of the prober 205A from the testing table 210 to the prober lift assembly 230A. The prober 205A is positioned below the prober lift assembly 230A to allow the lift members 262 to be lowered by the motors 260 to a position adjacent the lugs 266 on opposing sides of the prober 205A. The upper surface of the extensions 264 (FIG. 2A) are configured to support each of the lugs 266 from a bottom surface of the respective lugs 266 on the prober 205A. The prober 205A may be positioned in the Y direction by one or both of the prober platform 310 and testing table 210 to allow vertical clearance for the extensions. Once the upper surface of the extensions 264 are below and spaced apart horizontally and vertically from the bottom surface of the respective lug 266, the downward movement of the lift member 262 may cease.

The prober 205A may then be moved horizontally (Y direction) by one or both of the prober platform 310 and testing table 210 to a position where the lugs 266 are in a location to mate with the respective extension 264. When the lugs 266 and extensions 264 are aligned, the Z lifts 260 may be actuated to move the respective lift members 262 upward (Z direction) to provide contact between the upper surface of each extension 264 and the bottom of each lug 266. When this contact is made, the motors 260 may continue upward to a limit position adjacent the lower surface of the top 222. The prober 205A is in a storage position within the interior volume 200 and may be used in a later testing sequence or for subsequent transfer from the testing chamber 110.

To transfer the prober 205B from the storage position within the interior volume 200, the testing table 210 and/or the prober platform 310 is moved in the Y direction to a position below the prober lift assembly 230B. Once positioned to below the prober lift assembly 230B, the prober 205B may be actuated downward (Z direction) to position the prober 205B on the prober platform 310. The prober lift assembly 230B lowers the prober 205B to the upper surface of the prober platform 310 where the prober lifts 328 may be extended (Z direction) above the prober platform 310. Alternatively, the prober lifts 328 may be retracted and the prober 205B is lowered to the upper surface of the prober platform 310. Once contact between the lower surface of the prober 205B and the upper surface of the prober platform 310 is established, the prober lift assembly 230B may continue downward (Z direction) until there is sufficient space between the lugs 266 and extensions 264. When the lugs 266 and respective extensions 264 are sufficiently spaced-apart, the prober 205B may be moved horizontally (Y direction) by one or both of the testing table 210 and prober platform 310 to allow the prober lift assembly 230B to be raised upward. Once the lugs 266 have been spaced-apart from the extensions 264, the prober lift assembly 230B may be raised to a limit above the testing table 210. The prober 205B may now be positioned on the testing table 210 and readied for testing the next substrate in the queue, which may be substrate $S_3$.

The prober 205B may be used for testing one or more substrates having a substantially similar display and contact pad arrangement while the prober 205A is stored in the testing chamber 110. When the substrate queue requires a prober other than prober 205A or 205B, the probers 205A, 205B may be removed from the testing chamber 110 to be reconfigured or replaced with another prober or probers configured to test one or more display and contact pad configurations.

While the foregoing operational sequence has been described as testing two substrates requiring differently configured probers, the testing chamber may be configured to store and facilitate testing of more than two probers.

The invention claimed is:

1. A prober assembly adapted to test a large area substrate, comprising:
   a rectangular frame having a lateral member extending along the width of the frame with a length that is equal to or less than half of the length of the large area substrate and a longitudinal member extending along the length of the frame with a length that is equal to or greater than the width of the large area substrate;
   a plurality of prober pins extending from a lower surface of the frame along the length of the lateral and longitudinal members and adapted to contact the large area substrate; and
   a prober support member having a linear drive configured to laterally move the rectangular frame with respect to the substrate.

2. The apparatus of claim 1, wherein the frame further comprises a plurality of contact heads adapted to contact the large area substrate.

3. The apparatus of claim 1, wherein at least one of the lateral member or the longitudinal member includes a contact plate in communication with the plurality of prober pins.

4. The apparatus of claim 3, wherein the contact plate is disposed on the lower surface of the frame.

5. The apparatus of claim 1, wherein at least two opposing sides of the frame include at least one lug extending therefrom.

6. The apparatus of claim 1, wherein at least two opposing sides of the frame include at least two lugs extending therefrom.

7. The apparatus of claim 1, wherein two opposing sides of the frame include at least one lug extending therefrom and two sides of the frame include at least two lugs extending therefrom.

8. The apparatus of claim 1, wherein the width of the frame is adjustable.

9. The apparatus of claim 1, wherein the frame includes at least two indexing pins extending from the lower surface thereof.

10. A prober assembly adapted to test a large area substrate, comprising:
    a rectangular frame with a rectangular aperture formed therethrough and a cross-member extending across the aperture;
    a plurality of contact heads coupled to the cross-member and adapted to contact the large area substrate, wherein the rectangular frame comprises an area that is equal to or less than half of the area of the large area substrate; and
    a prober support member having a linear drive configured to laterally move the rectangular frame with respect to the substrate.

11. The apparatus of claim 10, wherein the plurality of contact heads include a plurality of prober pins extending from a lower surface thereof.

12. The apparatus of claim 10, wherein the width of the frame is equal to or less than half of a length of the large area substrate and the length of the frame is equal to or greater than a width of the large area substrate.

13. The apparatus of claim 10, wherein at least two opposing sides of the frame include at least one lug extending therefrom.

14. The apparatus of claim 10, wherein at least two opposing sides of the frame include at least two lugs extending therefrom.

15. The apparatus of claim 10, wherein two opposing sides of the frame include at least one lug extending therefrom and two sides of the frame include at least two lugs extending therefrom.

16. The apparatus of claim 10, wherein the width of the frame is adjustable.

17. A test system, comprising:
    a testing table sized to receive a rectangular substrate; and
    a prober assembly adapted to contact the substrate, wherein the prober assembly comprises:
      a rectangular frame having a lateral member and a longitudinal member; and
      a plurality of prober pins extending from a lower surface of the frame along the length of the lateral member and along the length of the longitudinal member and adapted to contact the substrate, wherein the rectangular frame comprises an area that is equal to or less than half of the area of the substrate and is movable by at least two motors along a length of the testing table.

18. The system of claim 17, wherein two opposing sides of the frame include at least one lug extending therefrom and two sides of the frame include at least two lugs extending therefrom.

19. The system of claim 17, wherein the width of the frame is equal to or less than half of the length of the substrate and the length of the frame is equal to or greater than the width of the substrate.

* * * * *